United States Patent [19]

Henderson

[11] 4,244,673
[45] Jan. 13, 1981

[54] CONSECUTIVE WAFER TRANSFER APPARATUS AND METHOD

[75] Inventor: William W. Henderson, Greenwich, Conn.

[73] Assignee: Emerson Plastronics, Bronx, N.Y.

[21] Appl. No.: 12,861

[22] Filed: Feb. 16, 1979

[51] Int. Cl.³ .............................................. B65G 65/04
[52] U.S. Cl. .................................... 414/405; 414/786
[58] Field of Search ............... 414/404, 405, 414, 786; 221/91; 53/246

[56] References Cited
U.S. PATENT DOCUMENTS 3,949,891  4/1976  Butler et al. .......................... 414/405

4,176,751  12/1979  Gillissie ........................... 414/405 X

Primary Examiner—Robert G. Sheridan
Attorney, Agent, or Firm—Kenyon & Kenyon

[57]     ABSTRACT

An apparatus and method for consecutively transferring wafers used in the fabrication of semiconductor devices between carriers having either the same spacing distance or different spacing distances are disclosed. A plate is positioned below an inverted first carrier and above a second carrier. The position of the plate and the second carrier is changed so that wafers fall consecutively from notches in the first carrier into every nth notch in the second carrier, where n is a positive integer.

14 Claims, 12 Drawing Figures

CONSECUTIVE WAFER TRANSFER APPARATUS AND METHOD

BACKGROUND OF THE INVENTION

The present invention relates in general to a method and apparatus for transferring wafers (particularly silicon wafers) used in the fabrication of semiconductor devices and in particular to a method and apparatus for consecutively transferring wafers between carriers having a wide range of different spacings.

Electronic semiconductor devices, e.g., transistors and integrated circuits, are typically fabricated in large groups of wafers. The fabrication process can involve many steps, including heating, cleaning, and etching steps. Groups of wafers are transported between processing stages in carriers (also called boats). The carrier walls have a series of notches (or slots) to hold the wafers and space them apart by a certain distance (hereinafter referred to as the "spacing distance"). Different carriers can have different spacing distances. For example, a carrier designed to hold wafers while they are heated in a furnace could have notches spaced very close together (i.e., have a small spacing distance) to maximize the number of wafers in the furnace. On the other hand, a carrier intended to hold wafers during the cleaning and etching stages would normally have notches spaced further apart (i.e., have a large spacing distance) to facilitate manipulation of individual wafers. Different carriers may also hold different numbers of wafers.

The use of carriers with different spacing distances creates a problem when transferring wafers between carriers. Such transfers are typically accomplished by placing a first empty carrier on top of a second full carrier. The carriers are then flipped and wafers fall from the second carrier into the first carrier. If, for example, the first carrier has a spacing distance half as great as the second carrier, the flipping operation will empty the second carrier but only fill every other slot in the first carrier.

The problem is even more serious if the ratio of the two carriers' spacing distances is not an integer (e.g., 2/1) but rather a fraction (e.g., ⅔). If the spacing distance of the first carrier is two-thirds of the spacing distance of the second carrier, some of the slots in the first carrier will line up with slots in the second carrier, and the flipping operation will fill some of the slots in the first carrier. However, other slots in the second carrier will line up with the lands between slots in the first carrier. Thus some wafers will remain in the second carrier.

Some solutions have been proposed to the problem of transferring wafers between carriers having different spacing distances. See, for example, U.S. Pat. No. 3,934,733 and U.S. Pat. No. 3,949,891. However, the devices disclosed in these patents cannot be used effectively to transfer wafers between carriers if the ratio of the two carriers' spacing distances is not an integer.

The above patented systems also cannot effectively transfer one wafer at a time. In some situations, it may be desirable to only transfer a certain number of wafers and leave the rest of the wafers in the original carrier.

SUMMARY OF THE INVENTION

It is an object of the present invention to provide a wafer transfer method and apparatus capable of transferring wafers between carriers having the same or different spacing distances.

It is another object of the invention to provide a wafer transfer method and apparatus capable of transferring wafers between two carriers when the ratio of the carriers' spacing distances is not an integer.

It is a further object of the invention to provide a wafer transfer method and apparatus capable of effecting transfer between carriers of only a selected group of wafers.

It is a further object of the invention to provide a wafer transfer method and apparatus which permits one wafer at a time to be transferred from one or more carriers to another carrier regardless of the number of wafers or the spacing distance of the carriers.

These and other objects of the present invention are achieved by a consecutive wafer transfer method and apparatus using a plate positioned under an inverted first carrier containing wafers. The first carrier and the plate are moved relative to a collector (which can be a second carrier or an intermediate holder from which the wafers are later transferred to a carrier) at velocities such that the notches in the first carrier are successively uncovered and wafers fall consecutively from the notches in the first carrier into notches in the second carrier. The relative velocities of the carriers and the plate are determined by the spacing distances of the two carriers. The speeds are set so that wafers fall one by one from the first carrier into the second carrier. By setting the speeds or distances travelled at appropriate values, transfers can be effected between carriers having different spacing distances. Furthermore, the transfer can be accomplished even though the ratio of the carriers' spacing distances is not an integer. The transfer procedure can be stopped after any number of wafers have been transferred, thereby permitting transfer of only a selected group of wafers. Indeed, the procedure can be stopped after each wafer is transferred, thereby permitting one wafer at a time to transfer from one carrier to another regardless of the number of wafers or the spacing distance of the carriers.

These and other aspects of the invention will be more apparent from the following description thereof when considered with the accompanying drawings and appended claims.

BRIEF DESCRIPTION OF THE DRAWINGS

The present invention is illustrated by way of example and not limitation in the figures of the accompanying drawings in which like references indicate similar parts and in which.

DETAILED DESCRIPTION OF THE INVENTION

Figure 1A:
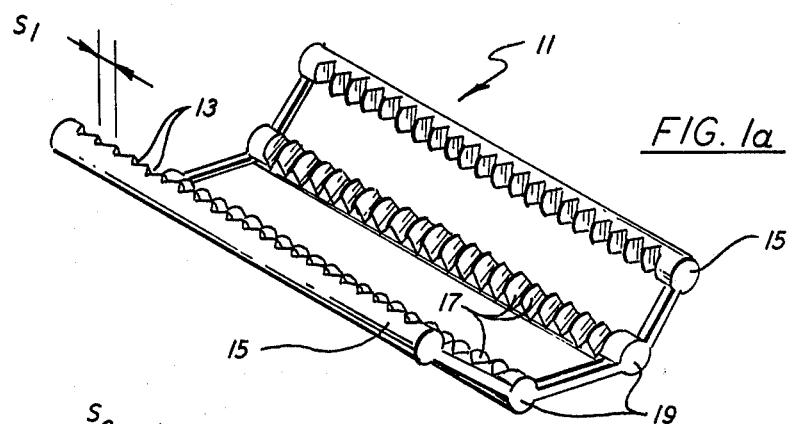
FIG. 1a is a perspective view of a boat, typically a quartz boat, having a spacing distance $S_1$.

Referring now particularly to the drawings, FIG. 1a is a perspective drawing of a conventional boat or carrier 11 suitable for holding semiconductor wafers. The wafers are supported by notches 13 in side members 15 and notches 17 in base member 19. The spacing distance between adjacent notches 13 on side members 15 and adjacent notches 17 on base members 19 is distance $S_1$.

Figure 1B:
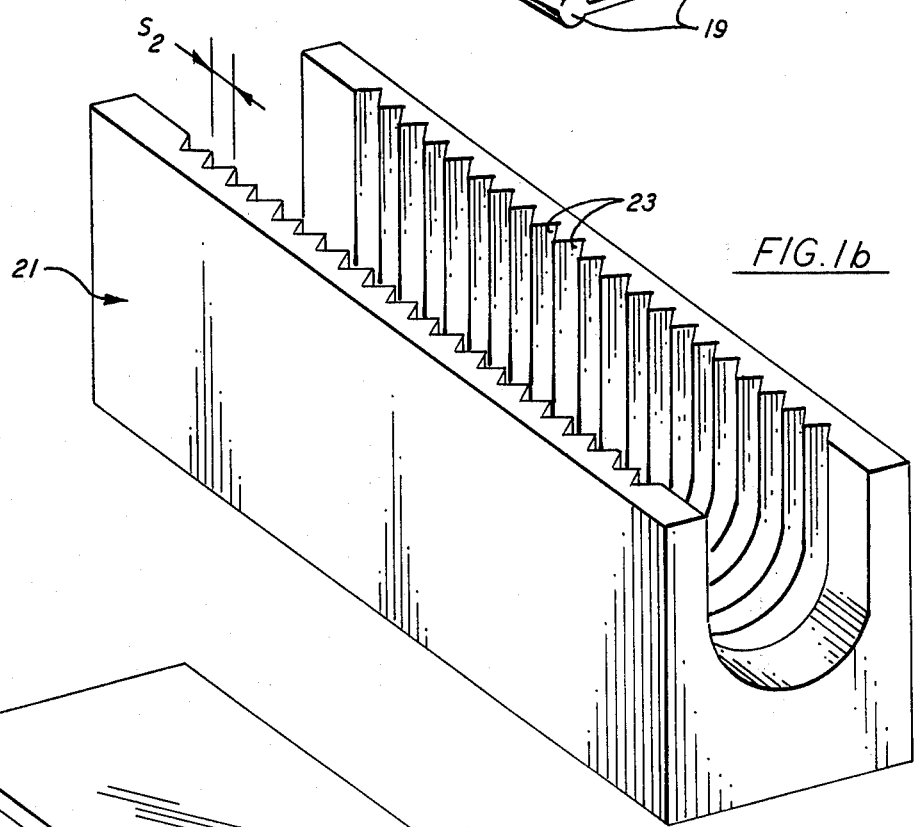
FIG. 1b is a perspective view of a wafer carrier having a spacing distance $S_2$.

FIG. 1b is a perspective view of a typical wafer carrier 21 suitable for carrying wafers. The wafers are supported by notches 23. The spacing distance between adjacent notches 23 is distance $S_2$.

Figure 1C:
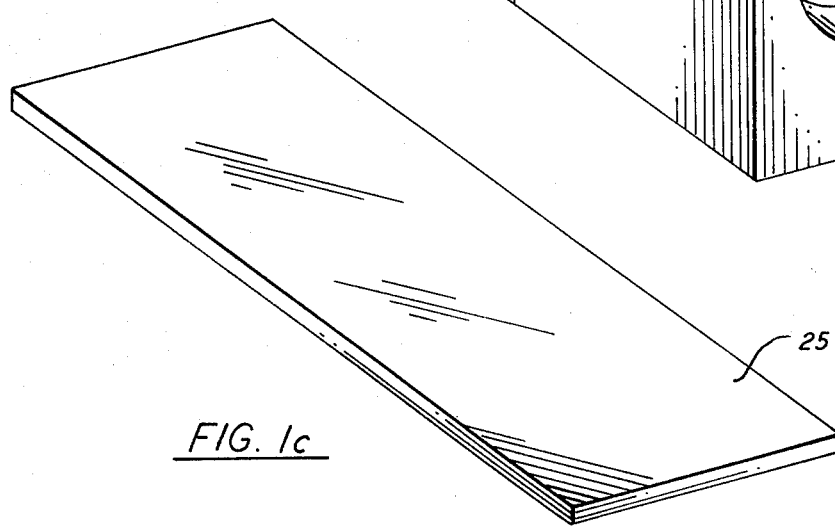
FIG. 1c is a perspective view of a plate.

FIG. 1c is a perspective view of a plate 25 suitable for use in the present invention. The plate can be made of many different materials. Preferably, the plate has a width approximately equal to the wafer width (i.e., approximately equal to the distance from the bottom of one notch to the bottom of the opposite notch holding the wafer in the carrier). The plate may be provided with ridges or openings to facilitate connection with the carrier or with drive means for moving the plate.

Figure 2A:
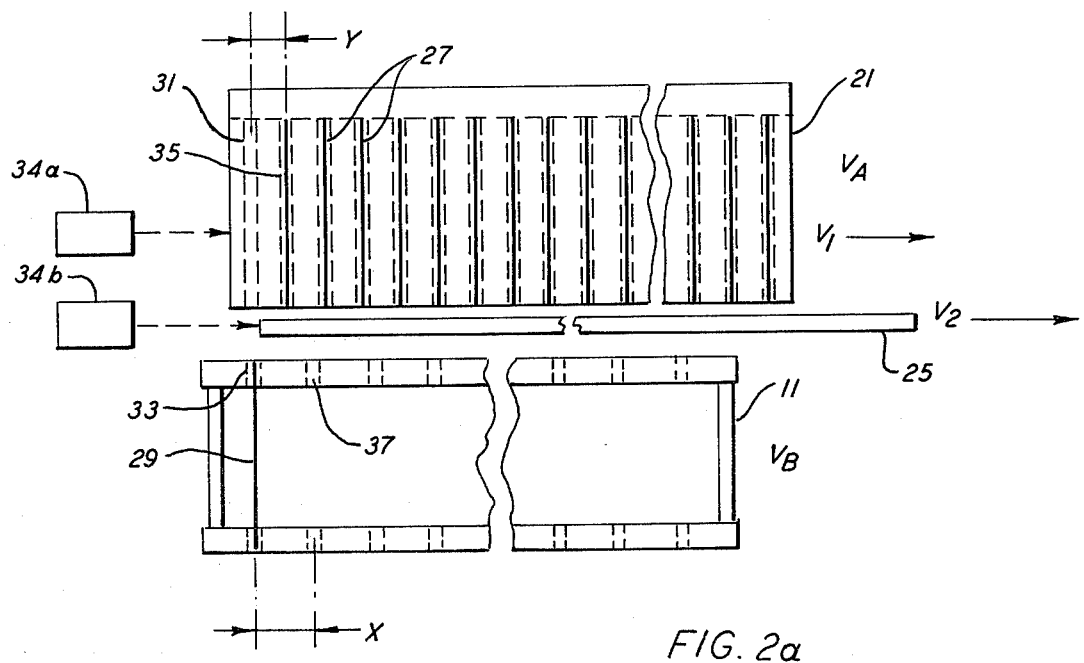
FIGS. 2a and 2b are schematic diagrams illustrating the consecutive transfer of wafers from a carrier having a small spacing distance to a carrier having a large spacing distance.

As shown in FIG. 2a, the transferor carrier 21 has a smaller spacing distance (y) than the spacing distance (x) of the transferee carrier 11. To transfer wafers from carrier 21, plate 25 is first placed on top of carrier 21. Depending on the configuration of carrier 21, plate 25 is either placed directly on the top of carrier 21 or carrier 21 is placed in a frame (not shown) which extends over the top of the wafers and plate 25 is placed on top of the frame.

Carrier 21 with plate 25 in place is then inverted and placed over boat 11. The plate 25 keeps the wafers 27 from falling out of carrier 21.

Figure 2B:
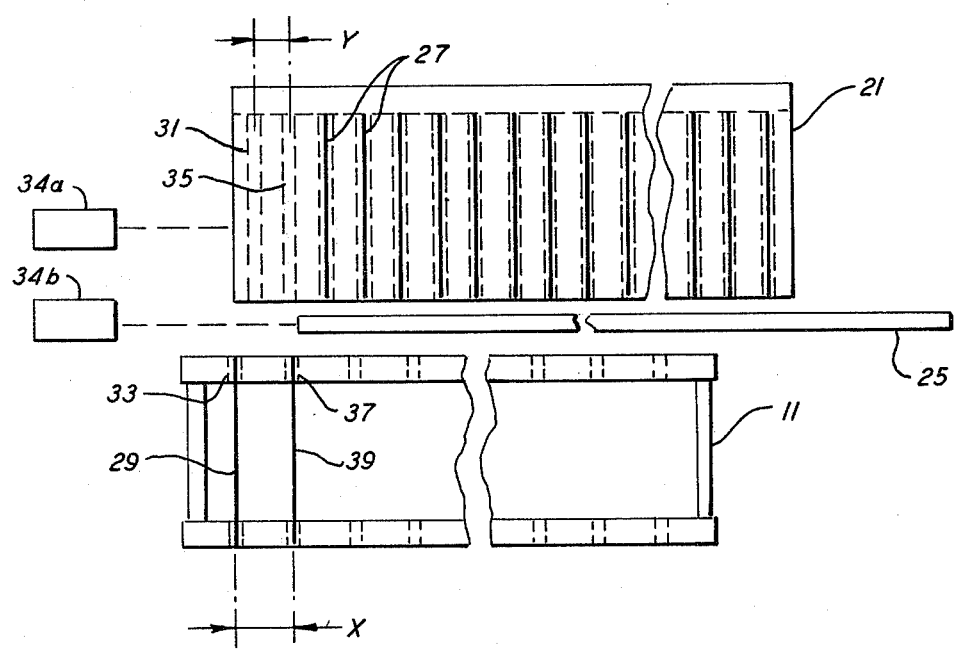

FIGS. 2a and 2b illustrate the transfer of wafers from a carrier having a small spacing distance to a carrier having a large spacing distance. In FIGS. 2-5, x is the spacing distance of the carrier to which wafers are transferred and y is the spacing distance of the carrier from which wafers are transferred. In FIG. 2a, wafer 29 has just fallen from carrier 21 into boat 11. At this point notch 31 in carrier 21 is in alignment with notch 33 in boat 11. The left edge of plate 25 is positioned just to the right of notch 33.

In FIG. 2b carrier 21 has been moved to the right a distance of x-y by drive means 34a. Plate 25 has been moved to the right a distance of x by drive means 34b. Notch 35 in carrier 21 is now in alignment with notch 37 in boat 11. Wafer 39 has just fallen into notch 37 in boat 11. Plate 25 is positioned just to the right of notch 37.

Assuming it took time $t_1$ to move from the position shown in FIG. 2a to position shown in FIG. 2b, the velocity of the carrier is $V_1=(x-y)/t_1$. The velocity of the plate is $V_2=x/t_1$. The ratio of these two velocities is:

$$V_1/V_2=(x-y)/x$$

If this ratio of velocities is maintained, wafers will continue to fall one by one from carrier 21 into boat 11. If the two carriers hold the same number of wafers, all of the notches in the carrier 21 will be emptied and all of the notches in boat 11 will be filled, even though the carrier and the boat have different spacing distances.

If the proper ratio of carrier and plate velocities is maintained, the transfer will be successfully accomplished even though the ratio of the carrier and boat spacing distances is not an integer. Assume, for example, that the carrier spacing is 0.125" and the boat spacing is 0.1875". The ratio of carrier to boat spacing is 0.1875"/0.125"=1.5. The ratio of spacing distances is not an integer. If the carrier 21 is moved to the right at the velocity of (0.1875"−0.125")/sec=0.0675"/sec and the plate is moved to the right at the velocity of 0.1875"/sec, the wafers will fall one by one from the carrier into the boat.

The successive transfer of wafers from carrier 21 into boat 11 can also be accomplished by moving the plate 25 and carrier 21 a specific distance in relation to boat 11. Assume for example, that a plate 25, carrier 21 and boat 11 were in the position shown in FIG. 2a, if the carrier spacing is 0.125" and the boat distance is 0.1875", then the transfer can be effected by moving the carrier 0.0675" to the right and then moving the plate 0.1875" to the right. In this method of transfer the relative velocity of plate and carrier is not important (indeed the plate can be moved after the carrier has stopped moving) and all that matters is the relative distance traveled by plate and carrier.

A selected group of wafers can be transferred by stopping the transfer process. For example, the first five wafers are transferred and then the movement of the carrier and the plate is stopped. The carrier is then flipped to an upright position or a second boat is put in position to receive wafers.

Wafers can also be transferred one by one between carriers having different spacing distances. After a wafer is transferred, the movement of the transferor carrier and plate is stopped. The drive means are then adjusted to change the relative speeds of the transferor carrier and plate. The next wafer (or series of wafers) can then be transferred to a carrier with a different spacing distance.

The means for moving the carrier and plate at the appropriate relative velocities can be lead screws, different speed motors, air or hydraulic cylinders, or other conventional means.

It is also possible to move the plate and carrier at the appropriate velocities by mounting them on series of side plates having pegs riding in slots. Placing the slots at appropriate angles will cause the plate and carrier to move different horizontal distances when the pegs move the same vertical distance, thereby giving the plate and carrier different horizontal velocities.

Figure 3A:
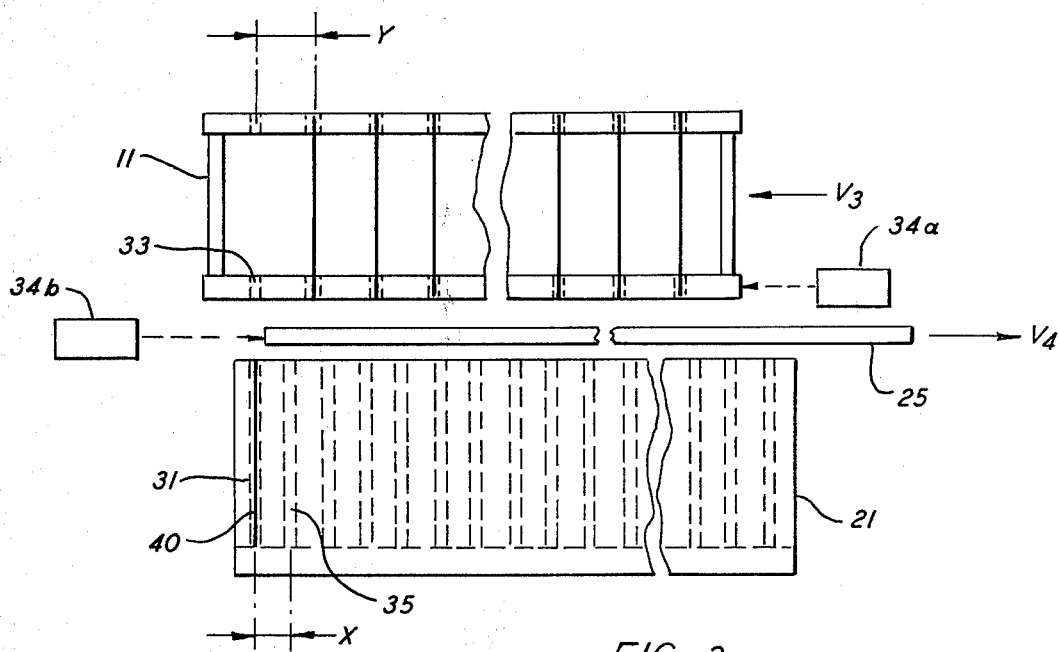
FIGS. 3a and 3b are schematic diagrams illustrating the consecutive transfer of wafers from a carrier having a large spacing distance to a carrier having a small spacing distance.
Figure 3B:
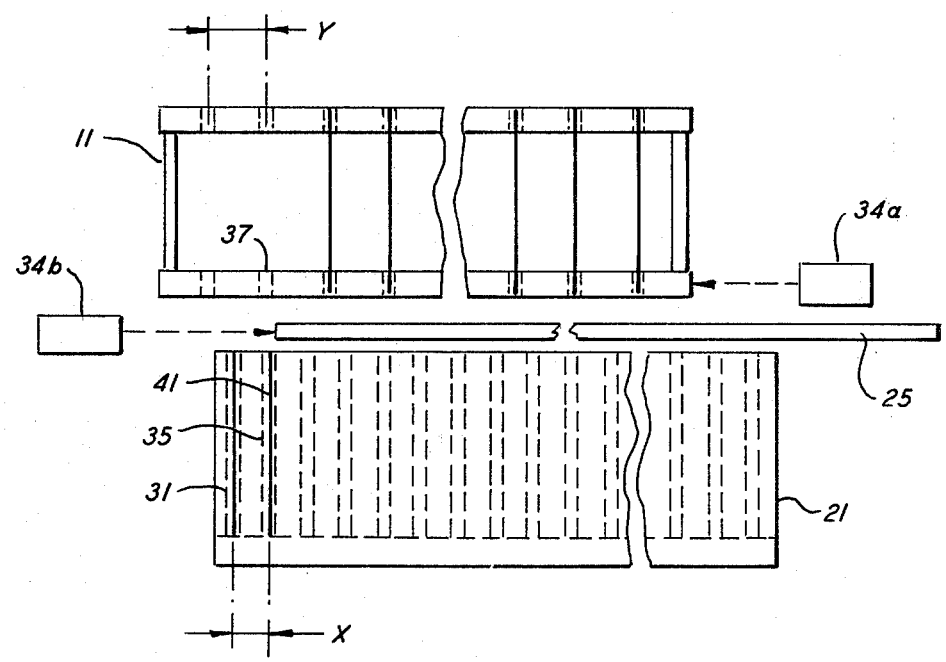

FIGS. 3a and 3b illustrate the transfer of wafers from a carrier having a large spacing distance to a carrier having a small spacing distance. In FIG. 3a, wafer 40 has just fallen from notch 3 in carrier 11 into notch 31 in carrier 21. Plate 25 is just to the right of notch 31. Carrier 11 is moving to the left at velocity $V_3$. Plate 25 is moving to the right at velocity $V_4$.

In FIG. 3b, carrier 11 has moved to the left a distance y−x and plate 25 has moved to the right a distance of x. Wafer 41 has just fallen from notch 37 in carrier 11 into notch 35 in carrier 21. The ratio of the carrier velocity $V_3$ to the plate velocity $V_4$ is:

$$V_3/V_4=(y-x)/x$$

If this ratio of velocities is maintained, wafers will fall one by one from carrier 11 into carrier 21. The transfer will be successfully accomplished even if the ratio of carrier spacing distances is not an integer. A selected group of wafers can be transferred, or wafers can be transferred one by one to carriers having different spacing distances.

Figure 4A:
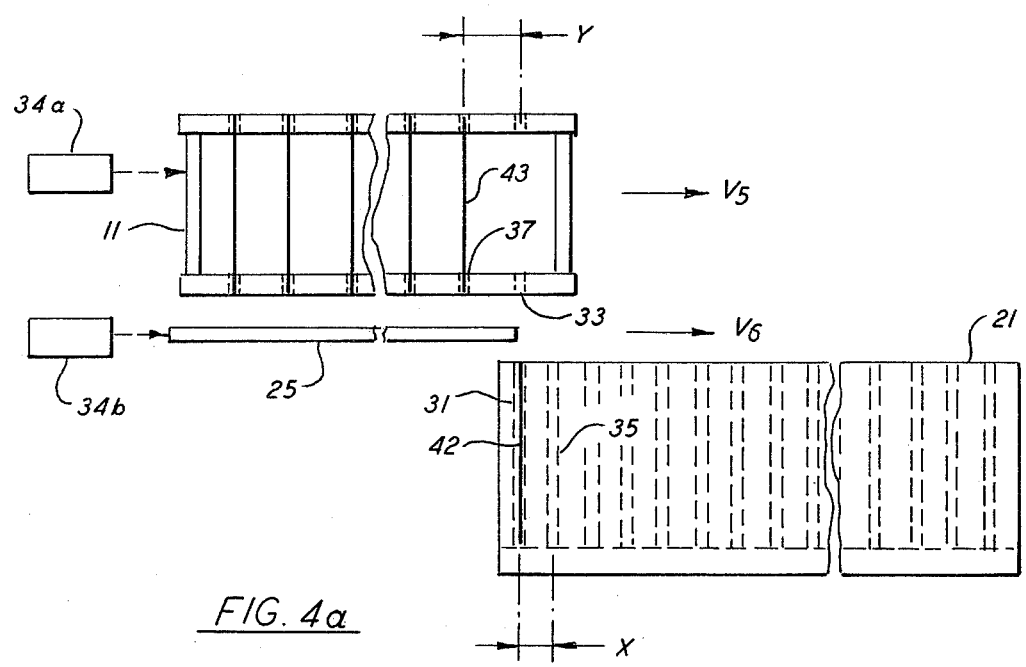
FIGS. 4a and 4b are schematic diagrams illustrating the consecutive transfer of wafers from a carrier with a large spacing distance to a carrier with a small spacing distance according to another aspect of the present invention.
Figure 4B:
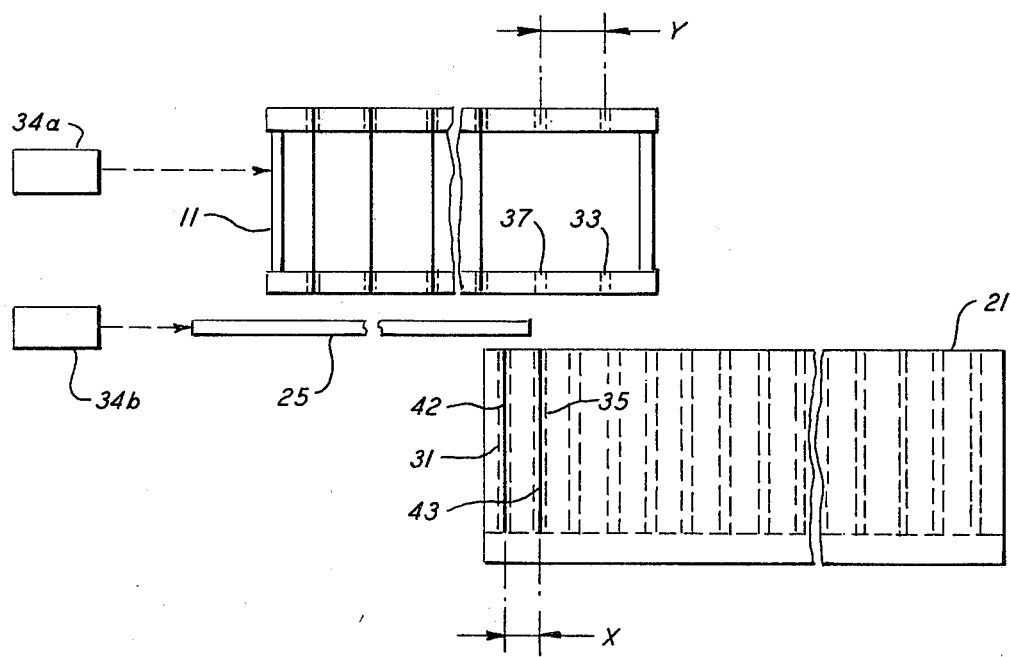

FIGS. 4a and 4b are schematic diagrams illustrating a second method of transferring wafers from a carrier with a large spacing distance to a carrier with a small spacing distance. In FIG. 4a, wafer 42 has just fallen from notch 33 in carrier 11 into notch 31 in carrier 21. Plate 25 is just to the left of notch 31. Plate 25 is moving to the right at velocity $V_5$ and carrier 11 is moving to the right at velocity $V_6$.

In FIG. 4b, carrier 11 has moved to the right a distance $x+y$ and plate 25 has moved to the right a distance of x. Wafer 43 has just fallen from notch 37 in carrier 11 into notch 35 in carrier 21. The ratio of the carrier velocity to the plate velocity is:

$$V_6/V_5 = (x+y)/x$$

If these relative velocities are maintained, wafers will fall one by one from carrier 11 into carrier 21.

Figure 5A:
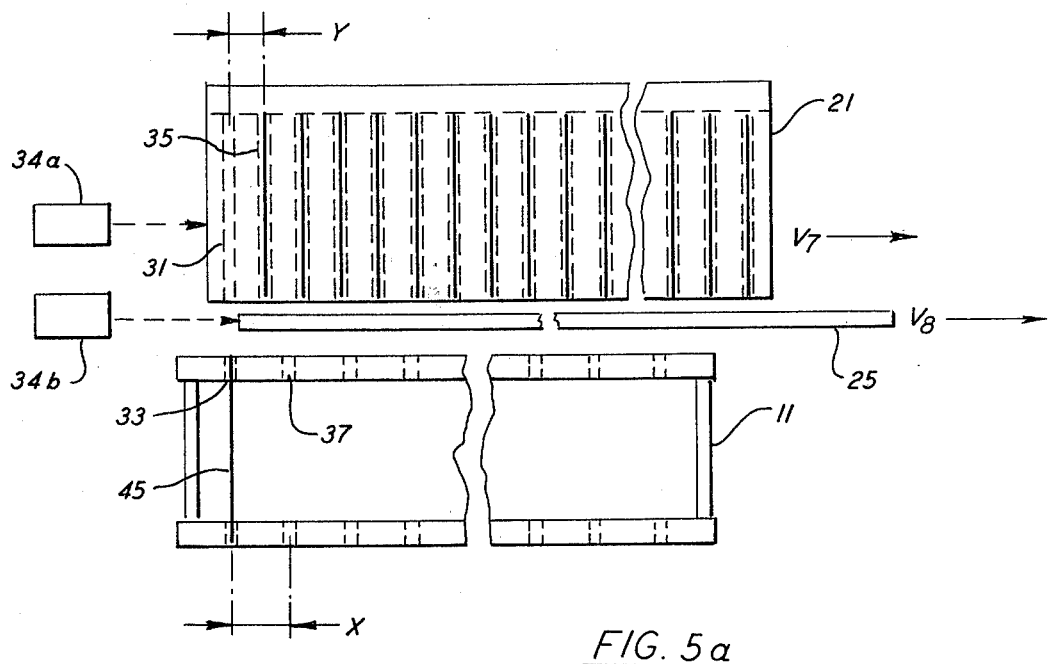
FIGS. 5a and 5b are schematic diagrams illustrating the consecutive transfer of wafers to alternate slots of a carrier.
Figure 5B:
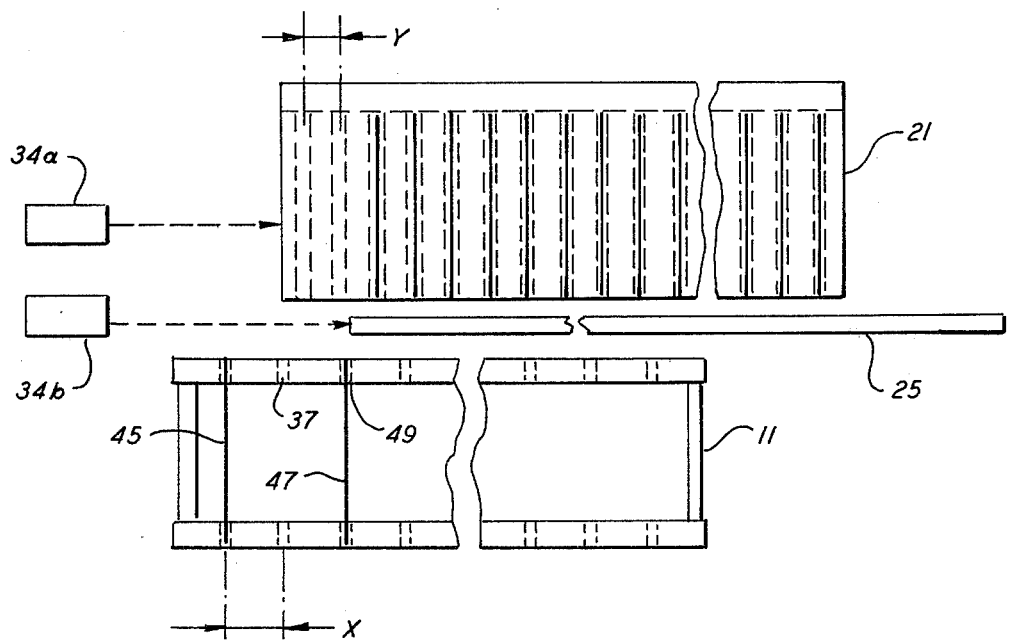

FIGS. 5a and 5b are schematic diagrams illustrating the transfer of wafers into alternate slots of a wafer carrier. In FIG. 5a, wafer 45 has just fallen from notch 31 in carrier 21 into notch 33 in carrier 11. Plate 25 is just to the right of notch 31 in carrier 11. Plate 25 is moving to the right at velocity $V_8$ and carrier 21 is moving to the right at velocity $V_7$. In FIG. 5b, carrier 21 has moved a distance $2x-y$ to the right and plate 25 has moved a distance 2x to the right. Wafer 47 has just fallen into notch 49. Notch 37 has been left empty. The ratio of carrier velocity to plate velocity is:

$$V_7/V_8 = 2x-y/2x$$

As long as this ratio of velocities is maintained, wafers will fall one by one into every other slot in carrier 11.

After the wafers in carrier 21 have been transferred into every other notch in carrier 11, wafers from another carrier (not shown) may be transferred in the same manner into the empty slots in carrier 11. In this manner, two different types of wafer can be interleaved in carrier 21.

To implement the consecutive wafer transfer device of the present invention, conventional means are provided to hold and accurately align the carriers and the plate so that the filled carrier is inverted above the plate and the carriers and plate are in position for the commencement of the transfer operation.

Plate 25 can be replaced by other retaining means, such as a rod, which will keep the wafers from falling prematurely and which can be moved to effect the successive transfer of wafers.

Figure 6:
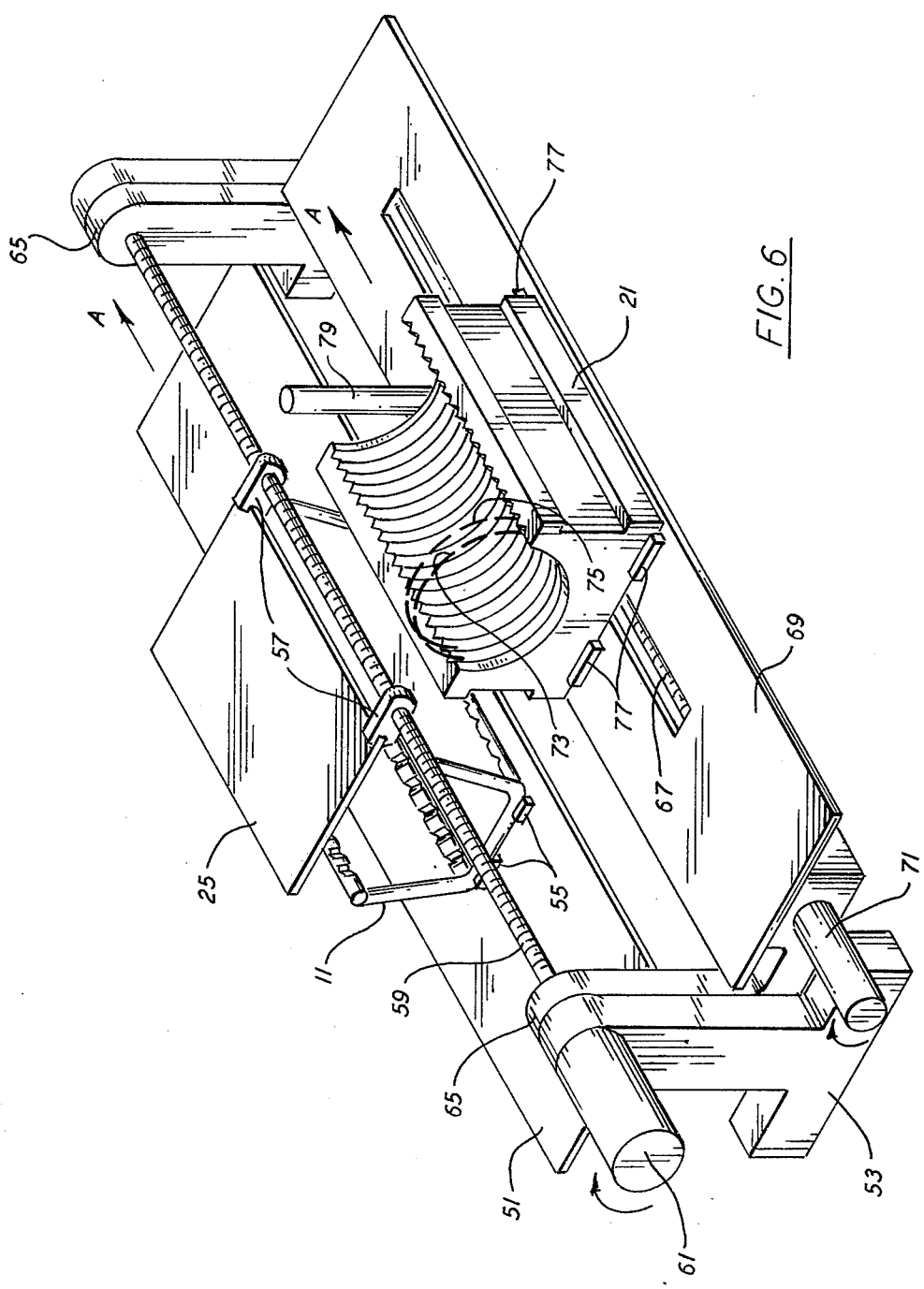
FIG. 6 is a perspective view of a consecutive wafer transfer device according to the present invention.

FIG. 6 is a perspective view of a consecutive wafer transfer device according to the present invention. Platform 51 is attached to frame 53 which has two upright sections connected by a cross-piece. Carrier 11 is mounted on platform 51 and held in alignment by mounting blocks 55.

Plate 25 is attached to clamps 57. Lead screw 59 which is threaded through clamps 57 passes through one upright section of frame 53 and is journaled in the other upright section. Handle 61 is attached to lead screw 59 so that plate 25 advances in direction A when handle 61 is turned clockwise.

Hinge 65 is rotatably mounted on lead screw 59 so that it can pivot about the long axis defined by lead screw 59. Lead screw 67 passes through the arm of hinge 65 and is threaded through supports on platform 69. Handle 71 is attached to lead screw 67 so that platform 69 advances in direction A when handle 71 is turned clockwise.

Carrier 21 containing wafers 73 and 75 (shown in outline) is mounted on platform 69 and held in alignment by mounting blocks 77.

To transfer wafers from carrier 21 with spacing distance y to carrier 11 with larger spacing distance x plate 25 is first rotated 180° to cover carrier 21. Support post 79 prevents plate 21 from pressing on wafers 73 and 75 and damaging them. Hinge 65 is then rotated 180° so that plate 25 and carrier 21 are superposed on carrier 11. Another support post holds plate 25 above carrier 11.

To transfer the wafers one by one, handle 71 is turned so that carrier 21 moves a distance $x-y$ in direction A. Handle 61 is then turned so that plate 25 moves a distance x, in direction A causing the next wafer in sequence to fall into carrier 11.

It is evident that the consecutive wafer transfer apparatus of the present invention may operate in different ways. In the examples heretofore discussed, the filled carrier and plate were moved to effect consecutive transfer of the wafers. If the proper relative velocities are maintained, consecutive transfer of the wafers can be accomplished by moving the plate and the unfilled carrier while the filled carrier remains stationary or by moving both carriers while the plate remains stationary.

The proper relative velocities to effect the transfer of wafers can be determined by using the plate as a frame of reference. To consecutively transfer wafers from a first carrier with spacing distance y to each slot in a second carrier with spacing distance x, the first carrier must move a distance y with respect to the plate, at the same time the second carrier is moving a distance x with respect to the plate. The motion of the carriers with respect to the plate may be in the same direction (FIGS. 2a and 2b and FIGS. 3a and 3b) or in opposite directions (FIGS. 4a and 4b). To transfer wafers to every nth slot of the second carrier, the first carrier must move a distance y with respect to the plate, while the second carrier moves a distance n·x with respect to the plate. If the velocity of the first carrier with respect to the plate is $V_A$ and the velocity of the second carrier with respect to the plate is $V_B$, then:

$$V_B = n(x/y)V_A$$

Again the correct relative velocities between carriers and plate can be established by moving the carriers or by moving either carrier and the plate.

Means can be provided to quickly install and remove several small capacity carriers when wafers are being transferred to or from large capacity carriers. If either carrier is made of quartz or other fragile material, a bumper (made, for example, of TFE) can be provided to prevent wafer chipping or damage during the transfer operation.

The collector which receives the wafers may be an intermediate holder rather than a second carrier. After the wafers have been successively transferred to the intermediate holder the wafers can be transferred from the intermediate holder to a carrier made of fragile material (e.g., quartz) without any large vertical drop of the wafers.

The advantages of the present invention, as well as certain changes and modifications of the disclosed embodiment thereof, will be readily apparent to those skilled in the art. It is applicant's intention to cover by his claims all those changes and modifications which could be made to the embodiment of the invention herein chosen for the purpose of the disclosure without departing from the spirit and scope of the invention.

I claim:

1. A wafer transfer apparatus for consecutively transferring wafers used in the fabrication of semiconductor devices from notches in an inverted first carrier to notches in a collector, which comprises:
   (a) retaining means positioned under the first carrier;
   (b) means for changing the relative position of the first carrier and retaining means so that successive notches in the first carrier are uncovered; and
   (c) means for changing the relative position of the retaining means and the collector, so that wafers fall consecutively from notches in the first carrier into every nth notch in the collector, where n is a positive integer.

2. The consecutive transfer apparatus of claim 1, which further comprises:
   means for aligning the second carrier under the retaining means before the wafers are transferred to the second carrier.

3. The consecutive wafer transfer apparatus of claim 1 wherein said retaining means comprises a plate.

4. A wafer transfer apparatus for consecutively transferring wafers used in the fabrication of semiconductor devices from notches in a first carrier to notches in a second carrier, which comprises:
   (a) a plate;
   (b) means for positioning the plate above the first carrier;
   (c) means for inverting the plate and first carrier;
   (d) means for positioning the second carrier below the plate and inverted first carrier;
   (e) means for moving the plate with respect to the first and second carrier so that notches in the second carrier are successively uncovered; and
   (f) means for moving the first carrier with respect to the plate so that wafers fall consecutively from notches in the first carrier into every nth notch in the second carrier, where n is a positive integer.

5. The consecutive wafer transfer apparatus of claim 4, wherein said plate has a width approximately equal to the width of the wafers.

6. A consecutive wafer transfer apparatus for transferring wafers used in the fabrication of semiconductor devices from an inverted first carrier having a spacing distance of y to a second carrier having a spacing distance of x, which comprises:
   (a) a plate positioned under the first carrier;
   (b) means for moving the first carrier at a velocity $V_A$ with respect to the plate, so that successive notches in the first carrier are uncovered; and
   (c) means for moving the second carrier along the same axis of motion as the first carrier at a velocity $V_B$ with respect to the plate, where $V_B = n(x/y)V_A$, so that wafers fall consecutively from notches in the first carrier into every nth notch in the second carrier, where n is a positive integer.

7. A consecutive wafer transfer apparatus for effecting the wafer by wafer transfer of wafers used in the fabrication of semiconductor devices from notches in an inverted first carrier to notches in a collector, which comprises:
   (a) a retaining means positioned under the first carrier;
   (b) means for moving the first carrier relative to the collector so that a wafer in the first carrier is aligned above a notch in the collector; and
   (c) means for moving the retaining means relative to the collector.

8. A method for consecutively transferring wafers used in the fabrication of semiconductor devices from a first carrier to a second carrier, which comprises:
   (a) positioning a plate above the first carrier;
   (b) inverting the plate and first carrier;
   (c) positioning the second carrier below the plate;
   (d) moving the plate along the length of the second carrier so that notches in the second carrier are successively uncovered;
   (e) moving the first carrier along the length of the plate so that wafers fall consecutively from notches in the first carrier into every nth notch in the second carrier, where n is a positive integer.

9. The method of claim 8, wherein N=1, so that wafers fall consecutively from notches in the first carrier into each notch in the second carrier.

10. A method of consecutively transferring wafers used in the fabrication of semiconductor devices from an inverted first carrier to a second carrier, which comprises:
    (a) positioning a plate under the first carrier;
    (b) moving the first carrier along the length of the plate so that successive notches in the first carrier are uncovered; and
    (c) moving the second carrier along the length of the plate so that wafers fall consecutively from notches in the first carrier into every nth notch in the second carrier, where n is a positive integer.

11. A method of effecting the wafer by wafer transfer of wafers used in the fabrication of semiconductor devices from an inverted first carrier to a collector which comprises:
    (a) positioning a retaining means under a first carrier;
    (b) moving the first carrier with respect to a collector a distance such that a wafer in a first notch in the first carrier is positioned above a second notch in the collector; and
    (c) moving the retaining means a distance such that the first notch in the first carrier is uncovered, thereby permitting the wafer to drop into the second notch in the collector.

12. A wafer transfer apparatus for consecutively transferring wafers used in the fabrication of semiconductor devices from notches in a first carrier to notches in a second carrier, which comprises:
    (a) a frame having two upright sections connected by a cross piece;
    (b) a plate having clamps on one side with aligned holes;
    (c) a first lead screw passing through one upright in the frame, threaded through the clamps in the plate, and journaled in the second upright of the frame;
    (d) a first handle attached to the first lead screw;
    (e) a first platform which supports the second carrier attached to one side of the frame;

(f) a hinge rotatably mounted on the first lead screw and having an arm extending outwardly on the other side of the frame;
(g) a second platform for supporting the first carrier positioned over the hinge arm and having supports with aligned holes;
(h) a second lead screw passing through the hinge and threaded through the supports on the second platform; and
(i) a second handle attached to the second lead screw.

13. The consecutive wafer transfer apparatus of claim 12, which further comprises:

a first set of mounting blocks for retaining the second carrier in position on the first platform; and
a second set of mounting blocks for retaining the first carrier in position on the second platform.

14. The consecutive wafer transfer apparatus of claim 13, which further comprises:

a first support post located on the second platform for positioning the plate above the first carrier; and
a second support post located on the first platform for positioning the plate and inverted first carrier above the second carrier.

* * * * *

UNITED STATES PATENT AND TRADEMARK OFFICE
CERTIFICATE OF CORRECTION

PATENT NO. : 4,244,673
DATED : January 13, 1981
INVENTOR(S) : William W. Henderson It is certified that error appears in the above—identified patent and that said Letters Patent is hereby corrected as shown below:

Column 4, line 58: Change "3" to --33--.

Signed and Sealed this

Twelfth Day of May 1981

[SEAL]

Attest:

RENE D. TEGTMEYER

*Attesting Officer*     *Acting Commissioner of Patents and Trademarks*